United States Patent
Barlini

(10) Patent No.: US 10,910,977 B2
(45) Date of Patent: Feb. 2, 2021

(54) METHOD FOR DETERMINING A STATE OF A BEARING, MODULE FOR DETERMINING A STATE OF A BEARING, RAILWAY VEHICLE AND SYSTEM

(71) Applicant: ALSTOM Transport Technologies, Saint-Ouen (FR)

(72) Inventor: Davide Barlini, Milan (IT)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 183 days.

(21) Appl. No.: 15/998,538

(22) Filed: Aug. 16, 2018

(65) Prior Publication Data

US 2019/0058428 A1    Feb. 21, 2019

(30) Foreign Application Priority Data

Aug. 17, 2017 (EP) .................................... 17306076

(51) Int. Cl.
*H02P 21/16* (2016.01)
*H02P 27/08* (2006.01)
(Continued)

(52) U.S. Cl.
CPC .............. *H02P 21/16* (2016.02); *F16C 17/00* (2013.01); *F16C 19/00* (2013.01); *F16C 19/527* (2013.01);
(Continued)

(58) Field of Classification Search
CPC .......... H02P 21/16; H02P 21/22; F16C 17/00; F16C 19/00
(Continued)

(56) References Cited

U.S. PATENT DOCUMENTS

2015/0323605 A1* 11/2015 Armitstead ............. H02P 29/02
                                                                324/765.01
2016/0282223 A1*  9/2016 Yamazaki ............. G01M 13/04
(Continued)

FOREIGN PATENT DOCUMENTS

DE        102015205412        9/2016

OTHER PUBLICATIONS

Bilal Akin et al: "Low Order PWM Inverter Harmonics Contributions to the Inverter-Fed Induction Machine Fault Diagnosis", IEEE Transactions on Industrial Electronics, IEEE Service Center, Piscataway, NJ, USA, vol. 54, No. 2, Feb. 1, 2008 (Feb. 1, 2008), pp. 610-619, XP011200761, ISSN: 0278-0046.
(Continued)

*Primary Examiner* — Kawing Chan
(74) *Attorney, Agent, or Firm* — B. Aaron Schulman, Esq.; Stites & Harbison, PLLC

(57) ABSTRACT

The present invention relates to a method for determining a state of a bearing of a three phase electric machine, the electric machine having a rotor, which is supported by the bearing, the electric machine being connected to a three phase inverter for supplying the electric machine with electric power, the three phase inverter being controlled to apply a pulse width modulation with a predefined scheme to create three phase currents, the method comprises: —determining a first phase current provided to the electric machine; —determining a second phase current provided to the electric machine, the second phase current being different to the first phase current; —determining the power spectral density of the park's vector based on the first phase current and the second phase current; —determining an amplitude of the power at a predefined frequency of the power spectral density, wherein the predefined frequency depends on the rotational speed of the rotor and the scheme of the pulse
(Continued)

width modulation; —comparing the amplitude of the power at the predefined frequency with a predefined power value; and—determining, based on the comparison, whether a failure of the bearing has occurred or the bearing is degraded.

18 Claims, 4 Drawing Sheets

(51) Int. Cl.
    *G01M 13/04*     (2019.01)
    *G01R 31/34*     (2020.01)
    *H02P 21/22*     (2016.01)
    *F16C 17/00*     (2006.01)
    *F16C 19/52*     (2006.01)
    *F16C 19/00*     (2006.01)

(52) U.S. Cl.
    CPC ........... *G01M 13/04* (2013.01); *G01R 31/343* (2013.01); *H02P 21/22* (2016.02); *H02P 27/08* (2013.01); *B60L 2200/26* (2013.01); *F16C 2233/00* (2013.01); *F16C 2380/26* (2013.01); *H02P 2205/03* (2013.01)

(58) Field of Classification Search
    USPC .......................................................... 318/490
    See application file for complete search history.

(56) References Cited

U.S. PATENT DOCUMENTS

2018/0241332 A1*   8/2018   Ottewill .................. H02P 21/16
2019/0339161 A1*   11/2019   Taguchi ................ G01M 13/02

OTHER PUBLICATIONS

Silva J L H et al: "Bearing failures diagnosis in three-phase induction motors by extended park's vector approach", Industrial Electronics Society, 2005. IECON 2005. 31st Annual Conference of IEEE, IEEE, Piscataway, NJ, USA, Nov. 6, 2005 (Nov. 6, 2005), pp. 2585-2590, XP010876322, DOI: 10.1109/IECON.2005.1569315 ISBN: 978-0-7803-9252-6.
European Search Report for EP 17306076, dated Jan. 25, 2018.

* cited by examiner

METHOD FOR DETERMINING A STATE OF A BEARING, MODULE FOR DETERMINING A STATE OF A BEARING, RAILWAY VEHICLE AND SYSTEM

The present invention concerns a method for determining a state of a bearing and notably the bearing consumption.

Further, the present invention relates to a module for determining a state of a bearing.

Additionally, the present invention relates to a railway vehicle comprising a module for determining a state of a bearing.

Finally, the present invention relates to a system for determining a state of a bearing.

A failure of a bearing of an electric machine is usually detected using different techniques. For example, temperature sensors, accelerometers, and/or microphones are used. Almost all of them deal with mechanical measurements.

In other disclosures also electrical measurements have been used, for example in the article "*Bearing Failures Diagnosis in Three-Phase Induction Motors by Extended Park's Vector Approach*" of José Silva et al (IEEE).

All these techniques are based on the fact that particular bearing failure produces a well-known characteristic frequency which depends only on the kind of failure, the rotor speed and the type of the bearing itself. However, the amplitude of this frequency is very small and often is covered by environment noise.

Object of the invention is to provide an improved method and a system for detecting a failure of bearing and for detecting the amplitude of the bearing consumption, which may be also used in noisy environment, for example in a railway vehicle.

According to one aspect, a method is provided for determining a state of a bearing of a three phase electric machine, the electric machine having a rotor, which is supported by the bearing, the electric machine being connected to a three phase inverter for supplying the electric machine with electric power, the three phase inverter being controlled to apply a pulse width modulation with a predefined scheme to create three phase currents, the method comprises:
  determining a first phase current provided to the electric machine;
  determining a second phase current provided to the electric machine, the second phase current being different to the first phase current;
  determining the power spectral density of the park's vector based on the first phase current and the second phase current;
  determining an amplitude of the power at a predefined frequency of the power spectral density, wherein the predefined frequency depends on the rotational speed of the rotor and the scheme of the pulse width modulation;
comparing the amplitude of the power at the predefined frequency with a predefined power value; and
determining, based on the comparison, whether a failure of the bearing has occurred or the bearing is degraded.

Further embodiments may relate to one or more of the following features, which may be combined in any technical feasible combination:
  the predefined frequency is determined based on a major peak of the power spectral density of the park's vector based on the first phase current and the second phase current and the rotational speed of the rotor, wherein the predefined frequency is at a frequency distance, which depends on the rotational speed and is preferably equal the rotational speed, from the major peaks;
  the predefined power value is the power at the predefined frequency of the power spectral density of the park's vector based on the first phase current and the second phase current determined for the electric machine with an undamaged bearing;
  the first phase current and the second phase current is determined at a first point in time, wherein the predefined power value is the power at the predefined frequency of the power spectral density of the park's vector based on the first phase current and the second phase current determined for the electric machine at a second point in time being previous to the first point in time, wherein, in particular the difference between the first point in time and the second point in time is at least one day, in particular at least one month;
  the three phase electric machine is an induction machine or a synchronous machine;
  the method further comprises: determining a time for maintenance of the electric machine based on the comparison;
  the method further comprises: running the electric machine at a predetermined rotational speed of the rotor; and/or
  the method further comprises: determining the scheme of the pulse width modulation, in particular based on the rotational speed.

According to another aspect, a module is provided for determining a state of a bearing of a three phase electric machine, the electric machine having a rotor, which is supported by the bearing, the electric machine being connected to a three phase inverter for supplying the electric machine with electric power, the three phase inverter being controlled to apply a pulse width modulation with a predefined scheme to create three phase currents, wherein the module is adapted to:
  determine a first phase current provided to the electric machine;
  determine a second phase current provided to the electric machine, the second phase current being different to the first phase current;
  determine the power spectral density of the park's vector based on the first phase current and the second phase current;
  determine an amplitude of the power at a predefined frequency of the power spectral density, wherein the predefined frequency depends on the rotational speed of the rotor and the scheme of the pulse width modulation;
  compare the amplitude of the power at the predefined frequency with a predefined power value; and
  determine, based on the comparison, whether a failure of the bearing has occurred or the bearing is degraded.

Further embodiments may relate to one or more of the following features, which may be combined in any technical feasible combination:
  the predefined frequency is determined based on a major peak of the power spectral density of the park's vector based on the first phase current and the second phase current and the rotational speed of the rotor, wherein the predefined frequency is at a frequency distance, which depends on the rotational speed and is preferably equal the rotational speed, from the major peaks;

the module further comprises: determining the scheme of the pulse width modulation, in particular based on the rotational speed;

the module is further connected to a first current sensor for measuring the first phase current and to second current sensor for measuring the second phase current; and/or the module is further adapted to receive information from a controller about the applied pulse width modulation scheme at the inverter or wherein the module is adapted to command the controller to apply the predetermined pulse width modulation scheme at the inverter.

According to another aspect, a vehicle, in particular a railway vehicle is provided, comprising a motor for driving the vehicle and a module for determining the state of a bearing according to an embodiment disclosed herein.

According to another aspect, a system is provided for determining a state of a bearing of a three phase electric machine, the electric machine having a rotor, which is supported by the bearing, the electric machine being connected to a three phase inverter for supplying the electric machine with electric power, the three phase inverter being controlled to apply a pulse width modulation with a predefined scheme to create three phase currents, wherein the system comprising a bearing state detection module adapted to:

determine a first phase current provided to the electric machine;

determine a second phase current provided to the electric machine, the second phase current being different to the first phase current;

determine the power spectral density of the park's vector based on the first phase current and the second phase current;

determine an amplitude of the power at a predefined frequency of the power spectral density, wherein the predefined frequency depends on the rotational speed of the rotor and the scheme of the pulse width modulation; wherein the system is further adapted to:

compare the amplitude of the power at the predefined frequency with a predefined power value; and determine, based on the comparison, whether a failure of the bearing has occurred or the bearing is degraded.

So that the manner in which the above recited features of the present invention can be understood in detail, a more particular description of the invention, briefly summarized above, may be read by reference to embodiments. The accompanying drawings relate to embodiments of the invention and are described in the following:

Figure 1:
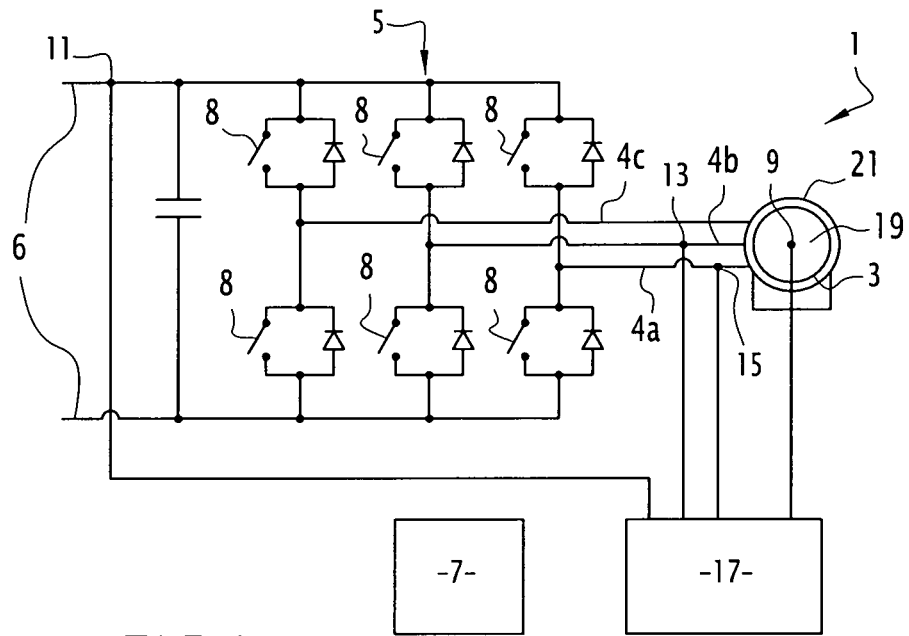
FIG. 1 shows schematically the energy supply of an electric machine with an inverter.

FIG. 1 shows schematically a system 1 of the energy supply of an electric machine 3 with an inverter 5. The electric machine 3 is a three phase electric machine which is connected to the inverter 5 via three lines 4a, 4b, 4c. For example, the electric machine 3 is an induction machine. In other embodiments the machine is a permanent magnet machine or a reluctance variable machine. For example, the electric machine is used for driving a railway vehicle. Thus, the electric machine is operated at different rotational speeds.

The inverter 5 is a three phase inverter which is connected to a direct current (DC) power supply 6 and generates a three phase AC (alternative current). In a three phase AC current each phase is shifted with respect to the other phases by one third of the period. The three phases are put out via the three lines 4a, 4b, 4c. The inverter comprises six sets of diodes and switches 8, in particular solid state switches 8, for example semiconductor switches. For each set, the respective diode and the respective switch are connected in anti-parallel.

The system 1 further comprises a controller 7 for controlling the inverter 5. For example, the controller 7 controls the closing and opening of switches 8 to create the AC current for each of the phases according to a specific PWM.

In an embodiment, the system comprises a voltage sensor 11 connected to the DC supply line 6, and at least two current sensors 13, 15, which are respectively connected to one of the lines 4a, 4b. In other embodiments, the sensors could be connected to one of the lines 4b and 4c or 4a and 4c. Further, optionally, the system comprises a sensor 9, which is used for determining the speed of the electric machine 3.

The sensors 9, 11, 13 and 15 are connected to a bearing state detection module 17. In some embodiments, the bearing state detection module 17 determines the rotational speed of the electric machine from two phase currents.

The first current sensor 13 is provided to sense a value for determining a first phase current and the second current sensor 15 is provided to sense a value for determining a second phase current. For example the first and second current sensors are respectively a Hall effect sensor or current transformer.

Figure 2:
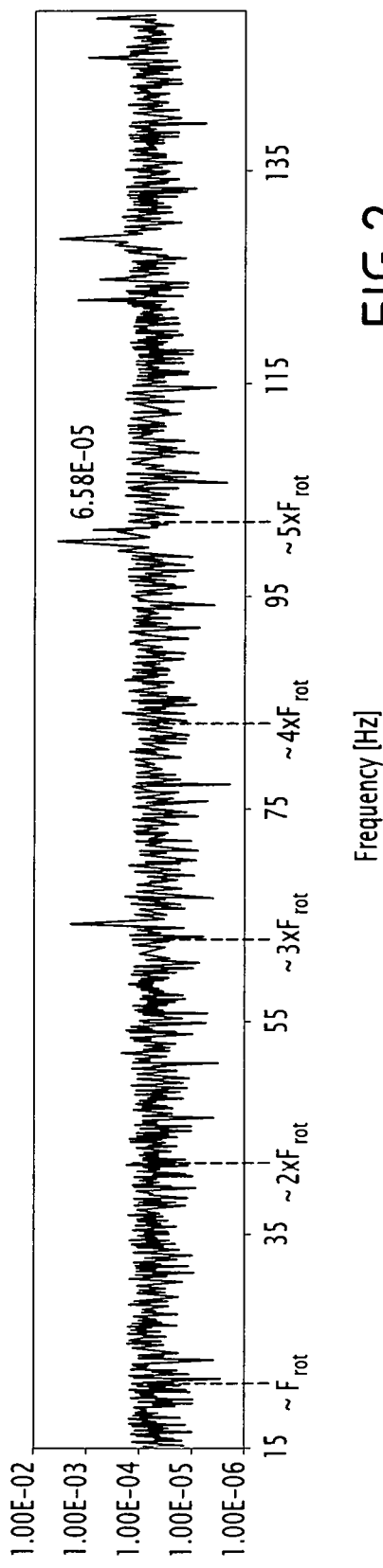
FIG. 2 shows the spectrum of vibrations of an electric machine with new bearing.
Figure 3:
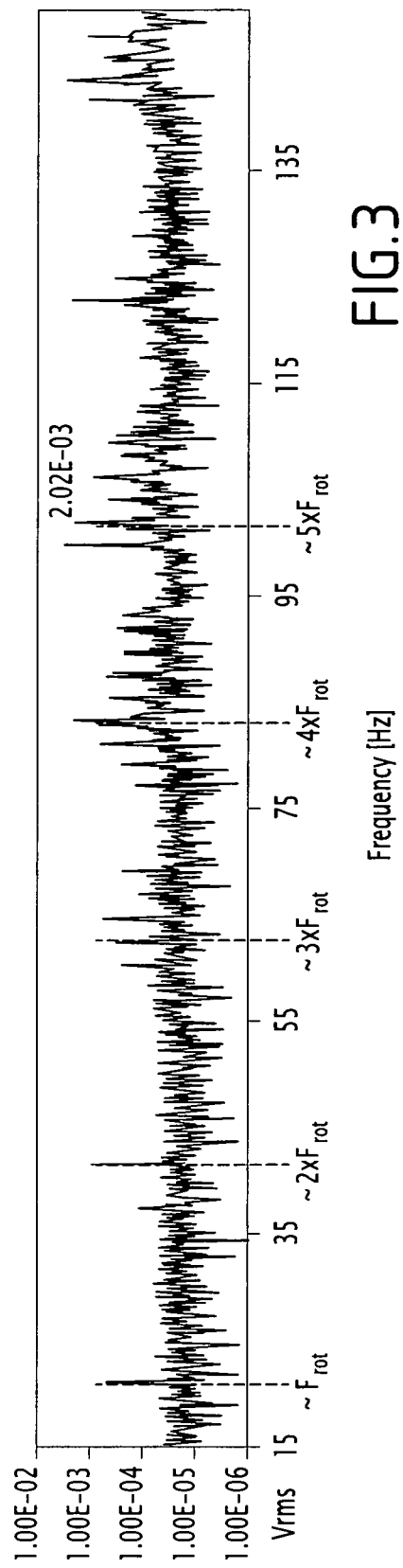
FIG. 3 shows the spectrum of vibrations of an electric machine with consumed bearing.

FIG. 2 shows the spectrum of vibrations of an electric machine with an undamaged bearing and FIG. 3 shows the spectrum of vibrations of an electric machine with a damaged bearing. A rotor 19 of the electric machine 3 rotates at 1250 rpm (rounds per minute) which corresponds to a rotational frequency $F_{rot}$=20.8 Hz. Thus, as it can be seen from FIG. 2, when the bearing is undamaged there is no peak at the rotational frequency and the multiple of the rotational frequency (harmonic frequencies). However, there might be some other peaks. In contrast, when the bearing is damaged, there are, in the example, peaks in the spectrum at the rotational frequency $F_{rot}$ and integer multiples of the rotational frequency. In FIG. 3 these peaks can be seen for example at $2 \times F_{rot}$, $3 \times F_{rot}$, $4 \times F_{rot}$, and $5 \times F_{rot}$ When the consumption of bearing occurs, the rotor of the electric machine 3 translates in radial direction according to the rate of the consumption of the bearing itself. In other words, the air gap between the rotor 19 and the stator 21 of the electric machine 3 varies, in particular in the rotational frequency. When the air gap varies, also the stator currents are affected, as the magnetic and electric fields are also altered. This change in the stator currents may be measured according to the invention. Thus, the used/consumed bearing frequency $F_{dis}$ is created in the phase currents, which may be in this example $F_{rot}$ and preferentially also multiples of the rotational frequency.

As consequence of the modulation strategy of the inverter, the phase current spectrum of the electrical machine 3 will show that additional frequencies ($F_{add}$) function of the fundamental frequency of the rotational frequency $F_{rot}$ are injected into the phase currents with high amplitude with respect to the environmental noise. It has to be noticed that the fundamental frequency of the phase currents, in case of an induction machine, is slightly different to the rotational frequency of the rotor and depends on the slip.

Figure 5:
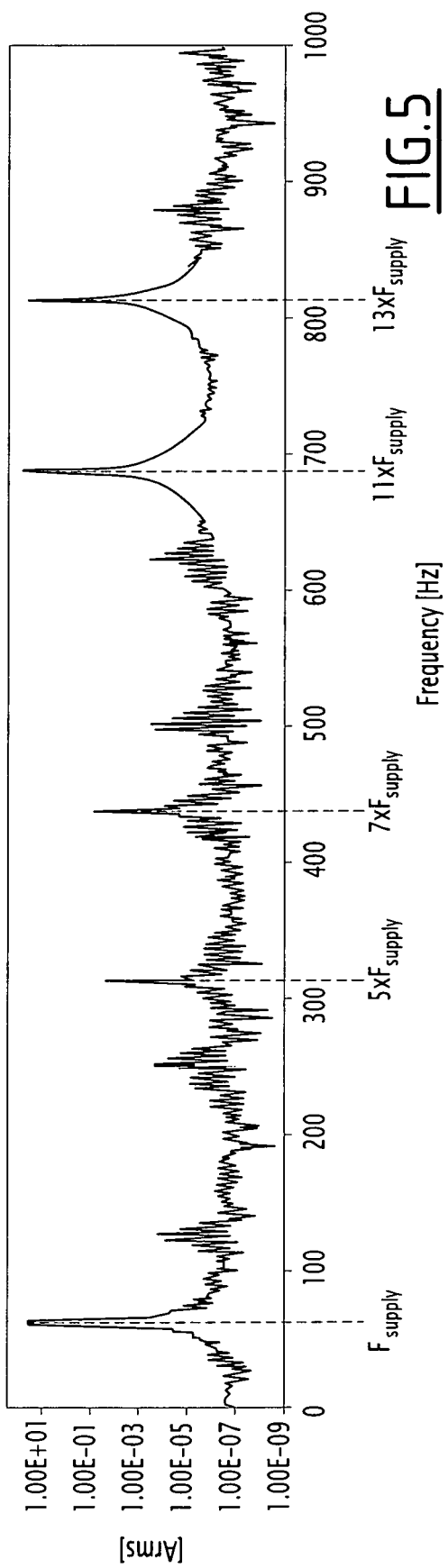
FIG. 5 shows the theoretical spectrum of a phase of the supply current of the electric machine, wherein a rotor rotates at 1250 rounds per minute (20.8 Hz)

The additional frequencies are, in the example of FIG. 5, the supply current frequency $F_{supply}$, $5 \times F_{supply}$, $7 \times F_{supply}$, $11 \times F_{supply}$ and $13 \times F_{supply}$.

The phase currents are combined in order to calculate the Park's vector. This operation produces a combination among the aforementioned frequencies, i.e. the additional frequencies and the consumed bearing frequency $F_{dis}$. As result the additional frequencies are modulated with the consumed bearing frequency $F_{dis}$. In consequence several couples of two peaks appear at the frequencies $F_{add}-F_{dis}$ and $F_{add}+F_{dis}$. The two peaks have amplitudes that depend on the amplitude of the additional frequency $F_{add}$ and amplitude of the consumed bearing frequency ($F_{dis}$). In the example shown above, the consumed bearing frequency ($F_{dis}$) or disturbance frequency corresponds to the rotational frequency $F_{rot}$.

According to an embodiment, a pulse width modulation is used to create the three phase currents. The pulse width modulation (PWM) generates a plurality of (rectangular) pulses of voltage with a variable length or width and sign in response to opening and closing of the switches 8. As inductors are present in the electric machine 3, for example in stator windings, the current is smoothened to produce a substantial sinusoidal current. However, each phase current has not an ideal sinusoidal shape. Thus each phase current presents, in the frequency spectrum, a plurality of harmonics, which will be explained here-below with respect to FIG. 5.

Figure 4:
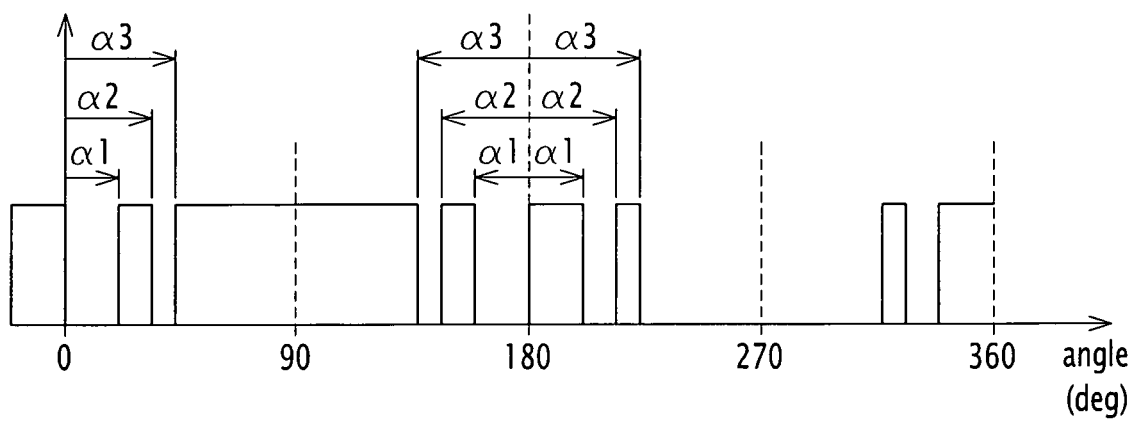
FIG. 4 shows an example switching angles of a PWM for an electric machine.

For an induction motor which runs at different speeds several schemes of PWM or pre-calculated switching angles are applied to minimize the harmonic content and reduce harmonic losses on the motor. In fact some frequencies can disturb the railway signaling system or inject higher losses into the motor. Each PWM or pre-calculated switching angles scheme has, for the phase currents, a specific pre-defined spectrum according to the frequencies that it is convenient to reduce. Typically, the spectrum depends only on the applied PWM. In an example, the pre-calculated switching angles impose at the output voltage of the inverter the symmetry of wave quarter (90°). In other words, the pulses of the PWM are activated or deactivated at predefined switching angles, $\alpha_1$, $\alpha_2$, $\alpha_3$, etc. FIG. 4 illustrates the switching angles of a PWM for an electric machine.

As a consequence, the Fourier analysis will provide only sinus components with odd harmonic $$v_0 = \sum_{k=1(disp)}^{\infty} \hat{V}_k \sin k\omega t. \qquad \text{Equation (1)}$$

With $$\hat{V}_k = \frac{1}{\frac{T}{2}} \int_{(T)} v_0(t) \sin k\omega t \, dt \qquad \text{Equation (2)}$$

It can be deduced that $$\hat{v}_k = \frac{4V}{k\pi}\left[1 - 2\sum_{i=1}^{n}(-1)^i \cos k\alpha_i\right] \qquad \text{Equation (3)}$$

This is the amplitude of the frequency k-multiple of the fundamental (with k equal 3, 5, 7, 9, etc).

Since the system can have several degree of freedom $\alpha_1$, $\alpha_2$, $\alpha_3$, etc (it depends on how many pulses you are able to apply) it could be convenient to impose some constraints to eliminate the harmonic ($V_k$) which produces more issues. For example in a predefined PWM scheme, the pre-calculated switching angles are used, which reduces the $5^{th}$ and $7^{th}$ harmonic. Such a PWM scheme may be called Calc3.

As result of such a PWM scheme the harmonic content of the phase current has reduced the harmonic frequencies corresponding at $5^{th}$ and $7^{th}$ as depicted in FIG. 4 (log scale). As pre-calculated switching angles reduce harmonic at low frequencies (the more distorting), high frequencies are also produced as consequence (the above mentioned "additional frequencies"). These frequencies can be used as carrier frequency to be modulated with the disturbance (the air-gap perturbation) in order to measure the amplitude of the bearing consumption.

According to the invention, the bearing state detection module 17 is adapted to calculate the direct current Id and the quadrature current Iq based on the first phase current and the second phase current with the constraint that for each instant the sum of the 3 phase current is equal to zero. The direct current Id and quadrature current Iq are orthogonal to each other in a complex plane and rotate with the speed of the rotor 19. In other words, the direct current Id and the quadrature current Iq are the electric machine phase currents in a rotating coordinate system rotating with the rotational speed of the rotor 19. For example, the direct current Id and the quadrature current Iq are calculated using a direct quadrature zero transformation. The transformation of the currents to the direct current Id and the quadrature current Iq may include a Park transformation and a Clark transformation. The direct current Id and the quadrature current Iq form the Park's vector.

FIG. 5 shows the theoretical spectrum of a phase current of the supply to the electric machine, wherein a rotor rotates at 1250 rounds per minute (20.8 Hz). For example, this may be current sensed by one of the sensors 13 or 15. According to an embodiment, the spectrum is calculated by a Fast Fourier Transformation. As it can be seen in the drawings, the spectrum has several peaks due to the frequency of the PWM (Calc3), in particular odd multiples of the supply current frequency $F_{supply}$. In the example of FIG. 5, the supply current frequency $F_{supply}$ has a (fundamental) frequency of 63 Hz, which is proportional to rotational frequency $F_{rot}$ by the number of the poles of the motor. In FIG. 5, the 11th harmonic at 688 Hz=$11 \times F_{supply}$ and the $13^{th}$ harmonic at 814 Hz=$11 \times F_{supply}$ have a relatively high peaks, whilst the 5th harmonic at 312 Hz=$5 \times F_{supply}$, the $7^{th}$ harmonic at 438 Hz=$7 \times F_{supply}$ are reduced by the pre-calculated switching angles of above example of PWM scheme (Calc 3). If another PWM scheme would be applied, other harmonics may be the highest peaks. That only odd harmonics have high peaks is a typical spectrum for a phase current generated by a PWM in the inverter 5, which is in particular due to the pre-calculated switching angles with 90° of wave symmetry.

According to an embodiment, the spectrum of the Park's vector is calculated, for example based on the absolute value or the square of the absolute value of the park's vector, in particular $|Id+j\ Iq|^2$, where the park's vector is Id+j Iq. In other words, the absolute value or the square of the absolute value of the park's vector is used for spectral analysis.

Figure 6:
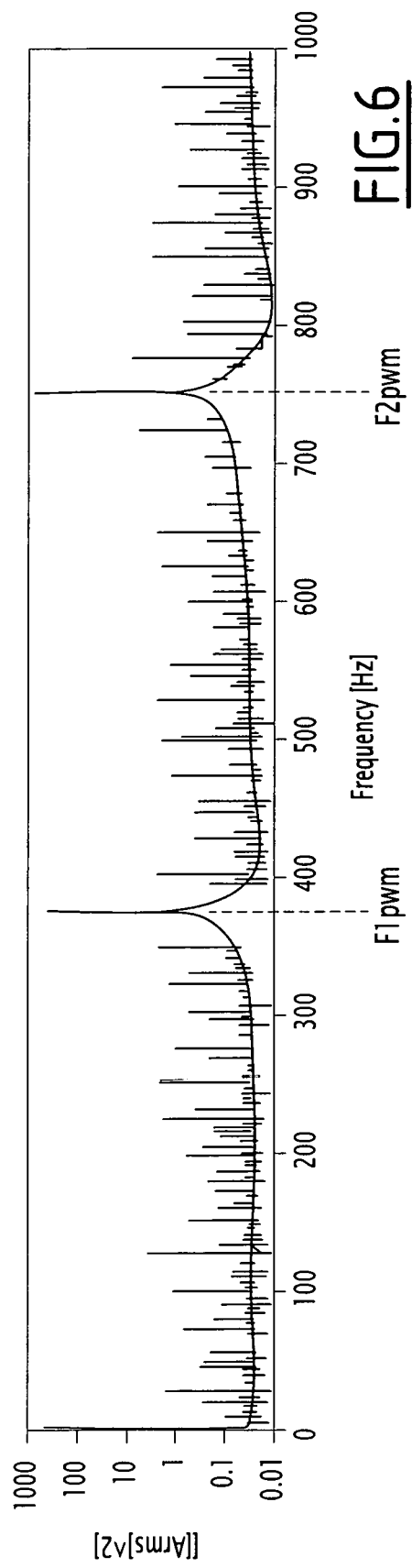
FIG. 6 shows the spectrum of the Park's Vector approach obtained by phase of the supply current of the electrical machine.

As it can be seen in FIG. 6, which is in logarithmic scale, for the example of a power supply having a fundamental frequency of 63 Hz, the fundamental frequency combines with the odd harmonic as follows. The $5^{th}$ harmonic (312 Hz)+the fundamental frequency (63 Hz) has the same frequency as the 7th harmonic (438)−the fundamental frequency (63 Hz)=375 Hz, corresponding to the 6th harmonic. Further, the 11th harmonic (688) and the fundamental frequency (63 Hz) have the same frequency as the 13th harmonic (814 Hz)−the fundamental frequency (63 Hz), corresponding to the 12th harmonic frequency at 751 Hz.

As it can be seen, the power spectrum of the module or square of the Park's vector includes only two major peaks into the considered frequency range, which are much higher than the remaining peaks. The major peaks have a power much larger than the remaining peaks, for example at least 10 times larger than the remaining peaks. FIG. 6 shows in the spectrum the major peaks at 0 Hz, at the $6^{th}$ harmonic (F1pwm=375 Hz) and the $12^{th}$ harmonic (F2pwm=751 Hz) of the fundamental frequency of the power supply current. The major peaks are known according to the speed and the PWM scheme applied. According to an embodiment, a PWM scheme is selected, which has only a limited number of major peaks in the power spectral density. A further selection criteria may be the amplitude of the major peak(s) and/or the frequency distance of the major peaks to the fundamental frequency.

In some embodiments, the controller 7 is adapted to inform the bearing state detection module 17 about the selected PWM scheme. Then, the bearing state detection module 17 determines automatically the frequencies of the modulated disturbance frequency around a major peak of the power spectral density.

In other embodiments, the bearing state detection module 17 commands the controller 7 to apply a predetermined PWM scheme, which is suitable for the detection of a bearing failure. For example, the PWM scheme is a PWM scheme normally used for motor controlling. As explained above, if a specific frequency is applied as disturbance $F_{dis}$, for example due to mechanical vibration, in particular due to a bearing failure or bearing consumption, further frequencies will appear in the calculated power spectral density of the Park's vector, namely A peak at the disturbance frequency $F_{dis}$, and
Respectively a couple of disturbance peaks centered around the major peaks of the power spectral density of the Park's vector, in particular at F1pwm-$F_{dis}$, F1pwm+$F_{dis}$, F2pwm-$F_{dis}$, and F2pwm+$F_{dis}$.

In other words, the additional major peaks of the PWM in the power spectral density of the phase current may be used to monitor the state of bearing or a disturbance.

Figure 7:
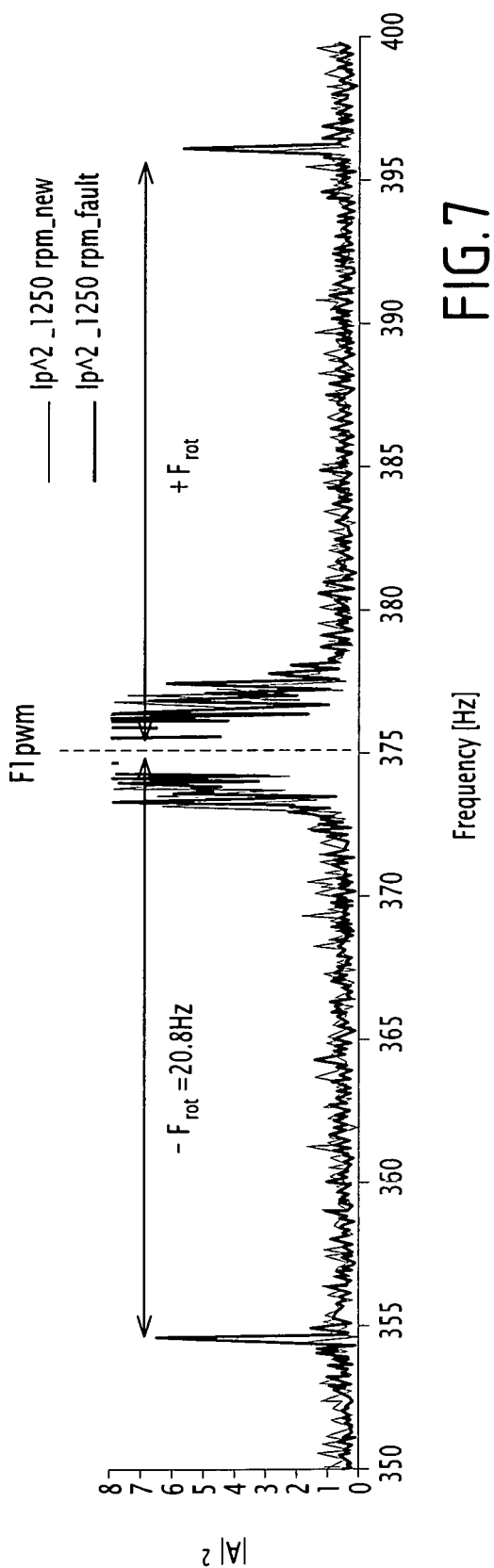
FIG. 7 shows an enlarged view of the measured spectrum of the Park's Vector approach obtained by phase of the supply current of the electric machine with new and used bearing.

FIG. 7 shows an enlarged view of the power spectral density of park's vector of the electric machine with new and consumed bearing. The thick line shows the section of the power spectral density around a major peak at F1pwm (375 Hz) wherein a consumed bearing and generating a noise at the disturbance frequency $F_{dis}$, which corresponds to the rotational frequency $F_{rot}$ of the rotor 19. The thin spectrum shows the same section of the power spectral density around the major peak of F1pwm without a disturbance frequency. Thus, it can be seen that two additional peaks with a frequency distance from the major peak, which depends on the rotational frequency and is preferably equal to the rotational frequency $F_{rot}$, are created around the $6^{th}$ harmonic, when a disturbance is present, which are not present if the electric machine has an undamaged bearing.

The amplitudes at the additional disturbance peaks at F1pwm-$F_{dis}$ and F1pwm+$F_{dis}$ depend on the severness of the bearing consumption. Thus, the additional disturbance peaks at F1pwm-$F_{dis}$ and F1pwm+$F_{dis}$ tend to increase over time before the bearing of the electrical machine breaks.

According to an embodiment, the amplitudes at the additional disturbance peaks are measured at a specific, predetermined rotational frequency $F_{rot}$ of the electric machine 3. For example, in case the electric machine 3 is provided to drive a vehicle, in particular a railway vehicle, the amplitudes at the additional disturbance peaks are measured at a predefined speed of the vehicle. In some embodiments, the rotational speed of the electric machine 3 will be selected depending on the used PWM scheme. In these cases the measurement of the bearing status will be triggered out once the train will achieve the convenient speed for making measurement. Further, for the selected PWM scheme the condition is F1pwm+$F_{dis}$=F2pwm-$F_{dis}$ for specific rotational frequencies of the electric machine. In such as case, as already detailed above, the amplitude of F1pwm+$F_{dis}$ will be summed at the amplitude at F2pwm-$F_{dis}$ providing more sensitivity at the measurement.

In other words, according to some embodiments, a PWM scheme is selected, where the power spectral density is concentrated in a few peaks and where environmental noise is not covering the signal.

According to an embodiment, the bearing consumption state detection module 17 is adapted to record the amplitude at the additional disturbance peaks at F1pwm-$F_{dis}$ and F1pwm+$F_{dis}$, in particular with a time stamp. In some embodiments, the bearing state detection module 17 determines that, if the additional disturbance peaks is or are greater than a predetermined value, an excessive bearing consumption will probably occur and/or has occurred. For example, if a bearing failure or consumption will probably occur within a specific time period, the bearing state detection module 17 is adapted to provide an alert.

In another embodiment, the bearing state detection module 17 is adapted to send the amplitude at the additional disturbance peaks at F1pwm-$F_{dis}$ and F1pwm+$F_{dis}$, in particular with a time stamp, to a computer at a maintenance site, in particular to a maintenance central computer. In such a case, the maintenance central computer is adapted to determine that, if the additional disturbance peaks is or are greater than a predetermined value, an excessive bearing consumption will probably occur and/or has occurred. For example, if the bearing failure or consumption will probably occur within a specific time period, the maintenance central computer is adapted to provide an alert. Thus, maintenance of the electric machine may be planned before the bearing failure occurs.

Figure 8:
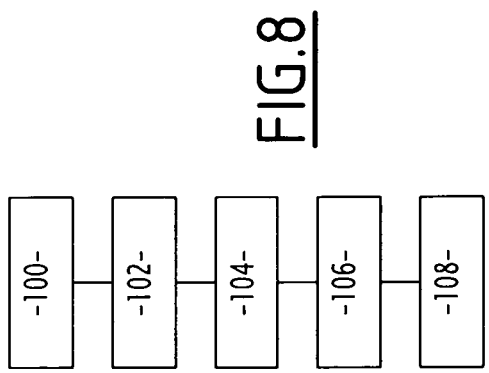
FIG. 8 shows schematically a flow chart of a method according to an embodiment of the invention.

FIG. 8 shows schematically a flow chart of a method according to an embodiment. In a first step 100, the first phase current provided to the electric machine and the second phase current provided to the electric machine are determined, for example by measuring the phase currents. In other embodiments, also the rotational speed of the electric machine 3 is measured.

In step 102; the power spectral density of the park's vector is determined or calculated, for example by the bearing state detection module 17, and in particular based on the rotational speed of the electric machine. For example, a Park transformation, a Clark transformation, and a Fast Fourier Transformation are used for that purpose.

In step 104, a predefined frequency of the power spectral density of the park's vector is selected, for example by the bearing state detection module 17. The predefined frequency depends on the rotational speed of the rotor 19 and a predetermined major peak or maximum of the power spectral density of the park's vector. For example, as shown in FIG. 7, the peak at F1pwm is selected, or the peak at F2pwm is selected. In some embodiments, the selected peak is sufficiently far away from the fundamental frequency of the phase current and the rotational frequency of the rotor of the electric machine 3. For examples major peaks with a frequency more than 4 times, in particular more than 6 times, of the fundamental frequency $F_{supply}$ of the phase current are selected, in particular to reduce a noisy environment of the major peaks, in particular for a Calc3 PWM scheme. The major peaks selected depend on the PWM scheme applied and are predefined depending on the PWM scheme applied and the fundamental frequency of the phase currents.

The predefined frequency is for example the frequency of a disturbance, in particular at the frequency of the rotor, modulated on the frequency of the predetermined major peak. Then, an amplitude value at the selected predefined frequency is read, and, in particular associated with a time stamp. In some embodiments, the amplitude value, in particular associated with the time value or time stamp, is sent to a maintenance central computer.

Then, in step 106, the amplitude of the power at the predefined frequency is compared with a predefined power value. For example, the comparison is performed by the bearing state detection module 17 and/or by the maintenance central computer.

In an embodiment, the predefined power may be a threshold value. For example, the threshold value may be used to determine in step 108 that maintenance of the electric machine has to be scheduled if the amplitude of the power at the predefined frequency is exceeding the threshold value. In other embodiments, the comparison may be used to determine in step 108 whether a failure will probably occur within a predetermined time frame.

In other embodiments, the predefined power value is the amplitude of the power spectral density at the predetermined frequency of an electric machine 3 without a failure, for example a new electric machine 3. Then, depending on ratio of the determined amplitude value with the predefined power value, it is determined in step 108 whether a failure has occurred or will probably occur within a predetermined time frame, for example within the next month.

According to the invention, the frequencies generated by the pulse width modulation are used as excitation frequency to detect a failure of the bearing and its consumption. Thus, it is possible to detect without additional sensors whether a bearing fault is and its usage.

The invention claimed is:

1. A method for determining a state of a bearing of a three phase electric machine, the electric machine having a rotor, which is supported by the bearing, the electric machine being connected to a three phase inverter for supplying the electric machine with electric power, the three phase inverter being controlled to apply a pulse width modulation with a predefined scheme to create three phase currents, the method comprising:

determining a first phase current provided to the electric machine;

determining a second phase current provided to the electric machine, the second phase current being different to the first phase current;

determining the power spectral density of the park's vector of the current provided to the electric machine, based on the first phase current and the second phase current;

determining an amplitude of the power at a predefined frequency of the power spectral density, wherein the predefined frequency depends on the rotational speed of the rotor and the scheme of the pulse width modulation, wherein the predefined frequency is in the power spectral density at a frequency distance, which is equal the rotational speed, from a major peak of the power spectral density of the park's vector of the current provided to the electric machine;

comparing the amplitude of the power at the predefined frequency with a predefined power value; and determining, based on the comparison, whether a failure of the bearing has occurred or the bearing is degraded.

2. The method according to claim 1, wherein the predefined frequency is determined based on the major peak of the power spectral density of the park's vector of the current provided to the electric machine, which is based on the first phase current and the second phase current, and on the rotational speed of the rotor.

3. The method according to claim 1, wherein the predefined power value is the power determined for the electric machine with an undamaged bearing at the predefined frequency of the power spectral density of the park's vector of the current provided to the electric machine based on the first phase current and the second phase current.

4. The method according to claim 1, wherein the first phase current and the second phase current is determined at a first point in time, wherein the predefined power value is the power at the predefined frequency of the power spectral density of the park's vector of the current provided to the electric machine based on the first phase current and the second phase current determined for the electric machine at a second point in time being previous to the first point in time.

5. The method according to claim 4, wherein the difference between the first point in time and the second point in time is at least one day.

6. The method according to claim 4, wherein the difference between the first point in time and the second point in time is at least one month.

7. The method according to claim 1, wherein the three phase electric machine is an induction machine or a synchronous machine.

8. The method according to claim 1, further comprising: determining a time for maintenance of the electric machine based on the comparison.

9. The method according to claim 1, further comprising: running the electric machine at a predetermined rotational speed of the rotor.

10. The method according to claim 1, further comprising: determining the scheme of the pulse width modulation.

11. The method according to claim 10, wherein the scheme of the pulse width modulation is determined based on the rotational speed.

12. A bearing state detector, wherein the bearing is for a three phase electric machine, the electric machine having a rotor, which is supported by the bearing, the electric machine being connected to a three phase inverter for supplying the electric machine with electric power, the three phase inverter being controlled to apply a pulse width modulation with a predefined scheme to create three phase currents, wherein the detector is adapted to:

determine a first phase current provided to the electric machine;

determine a second phase current provided to the electric machine, the second phase current being different to the first phase current;

determine the power spectral density of the parks vector of the current provided to the electric machine, based on the first phase current and the second phase current;

determine an amplitude of the power at a predefined frequency of the power spectral density, wherein the predefined frequency depends on the rotational speed of the rotor and the scheme of the pulse width modulation, wherein the predefined frequency is in the power spectral density at a frequency distance, which is equal the rotational speed, from a major peak of the power spectral density of the park's vector of the current provided to the electric machine;

compare the amplitude of the power at the predefined frequency with a predefined power value; and determine, based on the comparison, whether a failure of the bearing has occurred or the bearing is degraded.

13. The bearing state detector according to claim 12, wherein the predefined frequency is determined based on the major peak of the power spectral density of the park's vector of the current provided to the electric machine, which is based on the first phase current and the second phase current, and on the rotational speed of the rotor.

14. The bearing state detector according to one of the claim 12, further adapted to determine the scheme of the pulse width modulation.

15. The bearing state detector according to one of the claim 12, wherein the detector is further connected to a first current sensor for measuring the first phase current and to second current sensor for measuring the second phase current.

16. The bearing state detector according to one of the claim 12, wherein the detector is further adapted to receive information from a controller about the applied pulse width modulation scheme at the inverter or wherein the detector is adapted to command the controller to apply the predetermined pulse width modulation scheme at the inverter.

17. A vehicle comprising a motor for driving the vehicle and a detector for determining the state of a bearing according to one of the claim 12.

18. A system for supplying energy to a three phase electric machine comprising a bearing, and a rotor, which is supported by the bearing, the electric machine being connected to a three phase inverter for supplying the electric machine with electric power, the three phase inverter being controlled to apply a pulse width modulation with a predefined scheme to create three phase currents, wherein the system comprises a bearing state detector adapted to:

determine a first phase current provided to the electric machine;

determine a second phase current provided to the electric machine, the second phase current being different to the first phase current;

determine the power spectral density of the parks vector of the current provided to the electric machine, based on the first phase current and the second phase current;

determine an amplitude of the power at a predefined frequency of the power spectral density, wherein the predefined frequency depends on the rotational speed of the rotor and the scheme of the pulse width modulation, wherein the predefined frequency is in the power spectral density at a frequency distance, which is equal the rotational speed, from a major peak of the power spectral density of the park's vector of the current provided to the electric machine;

wherein the system is further adapted to:

compare the amplitude of the power at the predefined frequency with a predefined power value; and determine, based on the comparison, whether a failure of the bearing has occurred or the bearing is degraded.

* * * * *